(12) United States Patent
Harker et al.

(10) Patent No.: US 7,191,823 B2
(45) Date of Patent: Mar. 20, 2007

(54) OPTOELECTRONIC MODULE AND A THERMAL SWITCH THEREFOR

(75) Inventors: Andrew Harker, Ipswich (GB); Jerry Crouch, Stowmarket (GB); Simon Meadowcroft, Stowmarket (GB)

(73) Assignee: Avago Technologies Fiber IP (Singapore) Pte. Ltd., Singapore (SG)

( * ) Notice: Subject to any disclaimer, the term of this patent is extended or adjusted under 35 U.S.C. 154(b) by 364 days.

(21) Appl. No.: 10/773,607

(22) Filed: Feb. 6, 2004

(65) Prior Publication Data

US 2004/0184494 A1    Sep. 23, 2004

(30) Foreign Application Priority Data

Mar. 20, 2003    (EP)    .................................. 03251748

(51) Int. Cl.
 *F28F 27/00*    (2006.01)
(52) U.S. Cl. ......................................... 165/96; 165/276
(58) Field of Classification Search ................ 165/276, 165/96
See application file for complete search history.

(56) References Cited

U.S. PATENT DOCUMENTS

| | | | |
|---|---|---|---|
| 310,472 A * | 1/1885 | Stanley ........................ 337/119 |
| 3,176,101 A * | 3/1965 | Awender et al. ............. 337/119 |
| 3,302,703 A * | 2/1967 | Kelly .......................... 165/135 |
| 5,322,114 A * | 6/1994 | Grabner ....................... 165/276 |
| 5,740,191 A | 4/1998 | Bosch et al. |
| 6,247,524 B1 | 6/2001 | Slasky |
| 6,323,447 B1 * | 11/2001 | Kondoh et al. ............. 200/182 |
| 6,559,420 B1 | 5/2003 | Zarev |
| 6,771,086 B2 * | 8/2004 | Lutz et al. .................. 165/80.2 |

FOREIGN PATENT DOCUMENTS

| | | |
|---|---|---|
| DE | 603 821 | 10/1934 |
| DE | 13 01 386 | 8/1969 |
| WO | WO 02 073757 | 9/2002 |

* cited by examiner

*Primary Examiner*—Teresa J. Walberg

(57) ABSTRACT

A laser located within a casing of an optoelectronic module is operated by heating the laser to an operating temperature at or above the maximum specified, operating temperature of the module casing using a heater device within the module, the laser having operating characteristics at its operating temperature that are sufficient for its required function. The heater device can be separated from the module casing by an insulating layer or by a thermal switch. The thermal switch can include a droplet of thermally conductive fluid displaceable between a first position where it provides a low thermal impedance path between the heater device and the module casing and a second position wherein a high thermal impedance path is provided between the heater device and the module casing.

4 Claims, 6 Drawing Sheets

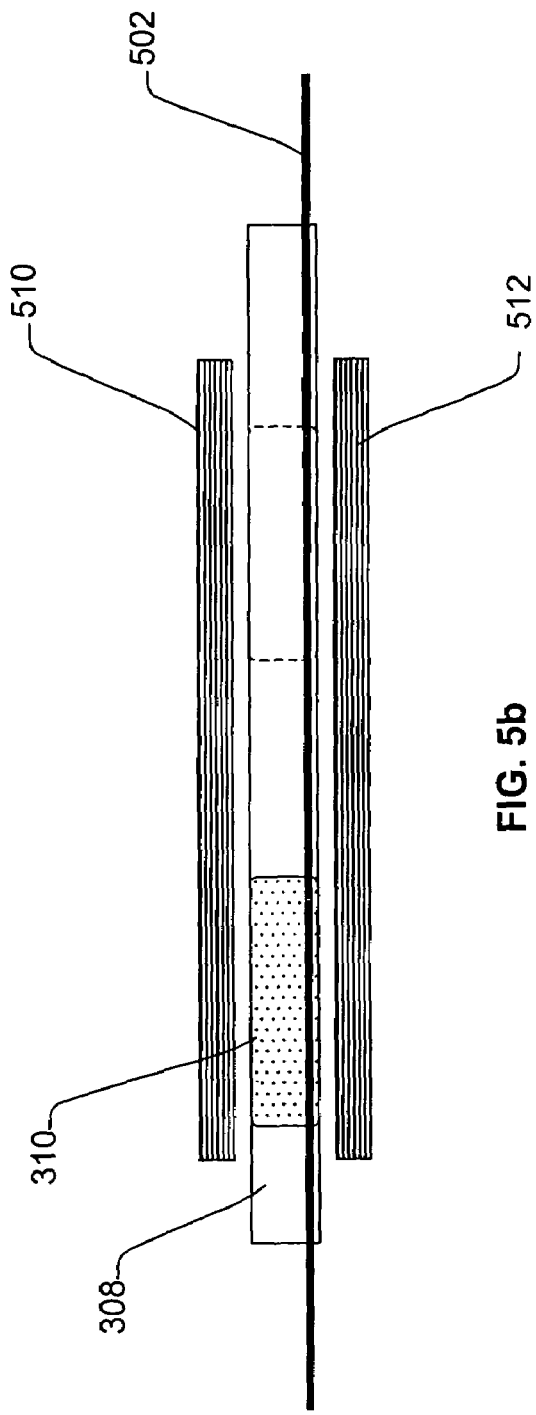
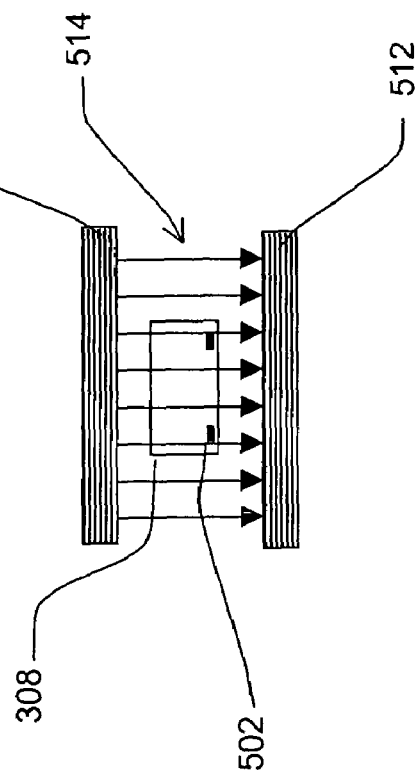
FIG. 5b
FIG. 5c

OPTOELECTRONIC MODULE AND A THERMAL SWITCH THEREFOR

This application claims benefit of the earlier filed European Application No. EP 03251748.4, Filed March 20.

The present invention relates to an optoelectronic module, especially one incorporating an active optoelectronic component, such as a laser, and to a thermal switch for use therein.

BACKGROUND OF THE INVENTION

1. Field of the Invention

In a fibre-optic network, the wavelength of light used to communicate a signal is an important parameter. In particular, where Dense Wavelength Division Multiplexing (DWDM) systems are employed, different signals are communicated using respectively different wavelengths. Consequently, it is important to maintain the different wavelengths accurately in relation to components of the DWDM system, for example multiplexers and demultiplexers, which add or remove wavelengths from the WDM system.

2. Brief Description of Related Developments

Typically, a semiconductor laser device is employed in an optoelectronic transmitter unit of a DWDM fibre-optic network. In order to maintain the output of the laser at the desired wavelength, the temperature of the laser must be accurately controlled. Thus, if the ambient temperature of the air surrounding an optoelectronic module is lower than the operating temperature of the laser, the laser must be heated up to its operating temperature and, conversely, if the ambient temperature of the air surrounding the optoelectronic module is higher than the operating temperature of the laser, the laser must be cooled down.

If the ambient air temperature can be guaranteed to remain below a particular level, then the laser temperature can be relatively easily controlled without overheating the module. However, in many circumstances, the module forms part of a larger system with many other components generating heat in the environment, so that the ambient air temperature may be much higher. In any event, the module must be able to operate at a specified ambient temperature range, which may reach as high as 75° C.

It will be appreciated that an optoelectronic module will dissipate heat if the ambient air temperature surrounding the module is lower than the temperature of the module casing. Of course, the greater the temperature differential between the module casing and the surroundings, the greater the rate at which heat will be dissipated from the module casing. Fins can be used to increase the rate of heat dissipation by increasing the surface area of the casing, but the provision of fins increases the external size of the module, which may be unacceptable in some circumstances, or reduces the internal space in the module, which may be similarly unacceptable. Furthermore, as the size of optoelectronic modules decreases with rising miniaturisation, the internal components in the module are packed more tightly together and the surface area of the module is reduced, in both cases exacerbating the problem of heating in the module.

Therefore, in many optoelectronic modules including a laser, a thermoelectric device has been used to control the temperature of the laser. For example, U.S. Pat. No. 6,247,524 teaches that the wavelength emitted by the laser diode in a diode-pumped solid state laser is extremely temperature-sensitive and therefore requires a temperature control mechanism to stabilise the diode at a set operating temperature. At low ambient temperatures in the "stand-by" mode, the diode laser is heated in order to stabilise the laser at the setpoint temperature. The thermoelectric device can heat the laser if the ambient temperature surrounding the module is low, but can also cool the laser if the ambient temperature surrounding the module is high relative to the operating temperature of the laser. Typical figures are that the operating temperature of the laser is about 25° C., with a module case temperature of about 75° C. It will be appreciated that this requires the laser to be cooled, which utilises substantial amounts of electrical power and consequently dissipates far more heat than it removes from the laser.

SUMMARY OF THE INVENTION

Therefore, according to a first aspect of the present invention, there is provided an optoelectronic module comprising a module casing having a maximum specified operating temperature, an active optoelectronic component located within the module casing and a heating device located adjacent the active optoelectronic component within the module casing for heating the active optoelectronic component to an operating temperature at or above the maximum specified operating temperature of the module casing, wherein the active optoelectronic component has operating characteristics at its operating temperature that are sufficient for its required function.

In one possible embodiment, the active optoelectronic component comprises a laser, although in another embodiment it comprises a semiconductor optoelectronic amplifier.

The active optoelectronic component may have a ratio of the slope efficiency of the component (the incremental increase in output power for an incremental increase in bias current) at 25° C. to the slope efficiency at 95° C. of greater than 0.8, and comprise an AlGaInAs laser, a GaNAs laser, a quantum dot laser or a semiconductor optical amplifier comprising AlGaInAs or GaNAs or quantum dots.

In one embodiment, the optoelectronic module further comprises a heat insulating layer between the active optoelectronic component and the module casing.

In a further embodiment, the optoelectronic module further comprises a thermal switch between the active optoelectronic component and the module casing.

According to a second aspect, the invention provides a method of operating an active optoelectronic component located within an optoelectronic module having a casing by heating the active optoelectronic component to an operating temperature at or above the maximum specified operating temperature of the module casing, the active optoelectronic component having operating characteristics at its operating temperature that are sufficient for its required function.

According to a third aspect, the invention provides a thermal switch for switchably providing either a relatively low or relatively high thermal impedance between a heat source side of the thermal switch and a heat sink side of the thermal switch, the thermal switch comprising a channel having a first location between the heat source and heat sink sides of the thermal switch and a second location, a thermally conductive fluid within the channel, the fluid having a surface tension such that it remains substantially as a single droplet and does not flow spontaneously along the channel, and means for displacing the thermally conductive fluid between the first and second locations in the channel.

In one embodiment, the first and second locations may comprise first and second cavities, respectively, in the channel for receiving the droplet of thermally conductive fluid, which substantially fills the cavity in which it is located.

The channel may extend between a first chamber and a second chamber, the first and second cavities being located between the first and second chambers.

The channel, the cavities and the chambers may be filled, except for the droplet of thermally conductive fluid, with a non-thermally conductive fluid.

At least the first chamber may include a heating means for heating the non-thermally conductive fluid so as to thereby increase its volume and exert pressure on the droplet of thermally conductive fluid located at the first location so as to displace it towards the second location.

The second chamber may also include a heating means for heating the non-thermally conductive fluid so as to thereby increase its volume and exert pressure on the droplet of thermally conductive fluid located at the second location so as to displace it towards the first location.

In one embodiment, the thermal switch further comprises an electrode pair in each of the cavities, each electrode pair being positioned within the respective cavity that an electrically conducting circuit is formed between the electrode pair by the droplet of thermally conductive fluid, which is also electrically conducting, thereby providing an indication of which cavity the droplet of thermally conductive fluid is located at.

In an alternative embodiment, the thermal switch further comprises a pair of electrodes extending in a plane through the length of the channel such that the droplet of thermally conductive fluid, which is also electrically conducting, provides an electrical path between the electrodes, and a pair of magnetic poles arranged to provide a magnetic field in a direction orthogonal to the plane containing the pair of electrodes and the longitudinal axis of the channel, whereby provision of electric current through the pair of electrodes and through the droplet of thermally conductive fluid, causes a force to be exerted on the droplet of thermally conductive fluid to move it along the channel between the first and second locations.

The thermal switch may further comprise a current source coupled between the electrodes at one end of the channel and a voltage meter electrically coupled across the current source, whereby the voltage meter measures a different voltage depending on the location of the droplet of thermally conductive fluid when an electric current is passed through the pair of electrodes.

BRIEF DESCRIPTION OF THE DRAWINGS

Particular embodiments of the invention will now be described, by way of example only, with reference to the accompanying drawings in which:

FIGS. 5a, 5b and 5c show, schematically, a second mechanism for moving thermally conductive fluid in the thermal switch of FIG. 3

DETAILED DESCRIPTION OF THE PREFERRED EMBODIMENT(s)

Recent developments in laser technology, particularly the introduction of quantum dot lasers, have enabled the manufacture of lasers which show considerably less performance degradation at elevated temperatures than established types such as quantum well and double heterostructure lasers. For example in, "High temperature performance of self-organised quantum dot laser with stacked p-doped active region" by Shchekin, O. B. ; Ahn, J.; Deppe, D. G. published in Electronics Letters, Volume 38, Issue 14, 2002, at pages 712–713, there is disclosed a laser which shows negligible performance degradation between 25° C. and 81° C. and only slight performance degradation between 25° C. and 101° C. at 10 mW output power.

The laser performance is thus adequate to operate up to or beyond 75° C. without being cooled. However, without a temperature controller, the wavelength of the laser will vary with the ambient temperature, which is incompatible with use in DWDM telecommunication systems.

Therefore, in accordance with a first embodiment of the present invention, this problem is overcome by mounting the laser or other semiconductor optoelectronic device on a heater and maintaining its temperature substantially constant and at or above the maximum operating temperature of the module casing. Suitable heaters include resistance heaters, including thin film heaters, or thermoelectric devices operated as heaters. The laser wavelength can be stabilised using a conventional wavelength locker and feedback circuit, with the feedback circuit controlling the power supplied to the heater.

A suitable semiconductor optoelectronic device, such as a laser, is one where the ratio of the slope efficiency of the laser (the incremental increase in output power for an incremental increase in bias current) at 25° C. to the slope efficiency at 95° C. is greater than 0.8. Such a device may be a laser comprising AlGaInAs or a laser comprising GaNAs or a laser comprising quantum dots, or a semiconductor optical amplifier comprising AlGaInAs or GaNAs or quantum dots. This may be compared with a typical standard laser which would have a slope efficiency ratio of less than 0.7.

Figure 1:
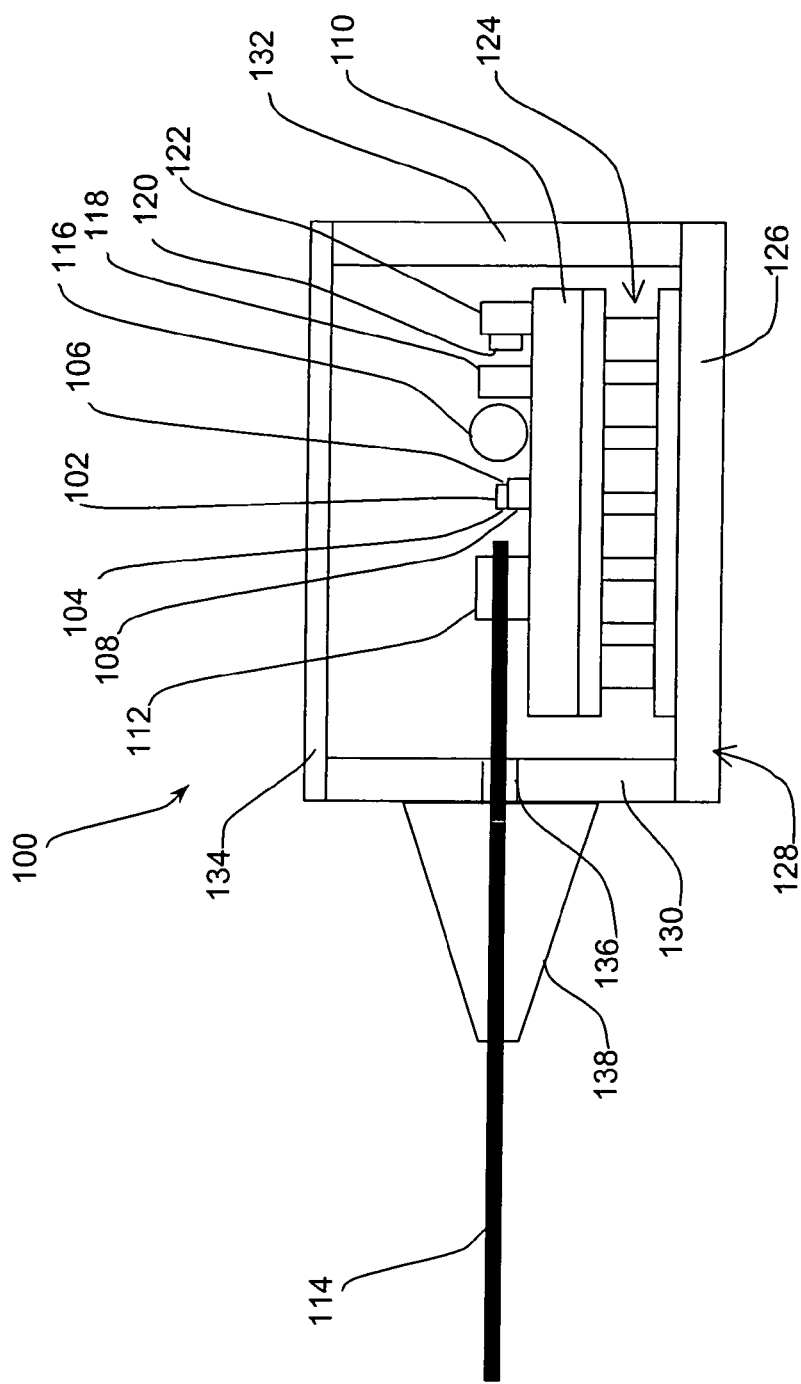
FIG. 1 is a schematic diagram of a known optoelectronic module.

FIG. 1 shows a known optoelectronic module 100 including a laser 102 having a front facet 104 and a rear facet 106 mounted on a heatsink 108, which is, in turn, mounted on a substrate 110. A fibre 114 is aligned to receive light from the front facet 104 of the laser 102 and is attached to the substrate 110 using clip 112. Disposed at the rear facet 106 of the laser 102 are a ball lens 116, an etalon 118 and a photodiode pair 120 mounted on a block 122. The ball lens 116, etalon 118 and photodiode pair 120 together comprise a wavelength locker. The substrate 110 is mounted on a thermoelectric device 124, which is itself mounted on a base 126 of the package 128 forming the casing of the module. The package 128 further comprises a front wall 130, a rear wall 132, a lid 134 and side walls (not shown). The fibre 114 is led out of the package 128 through an aperture 136 in the front wall 130 and secured with a bush 138. The package may be hermetically sealed. Not shown in the drawing are the electrical connections to the laser 102, the photodiode pair 120 and the thermoelectric device 124.

Figure 2:
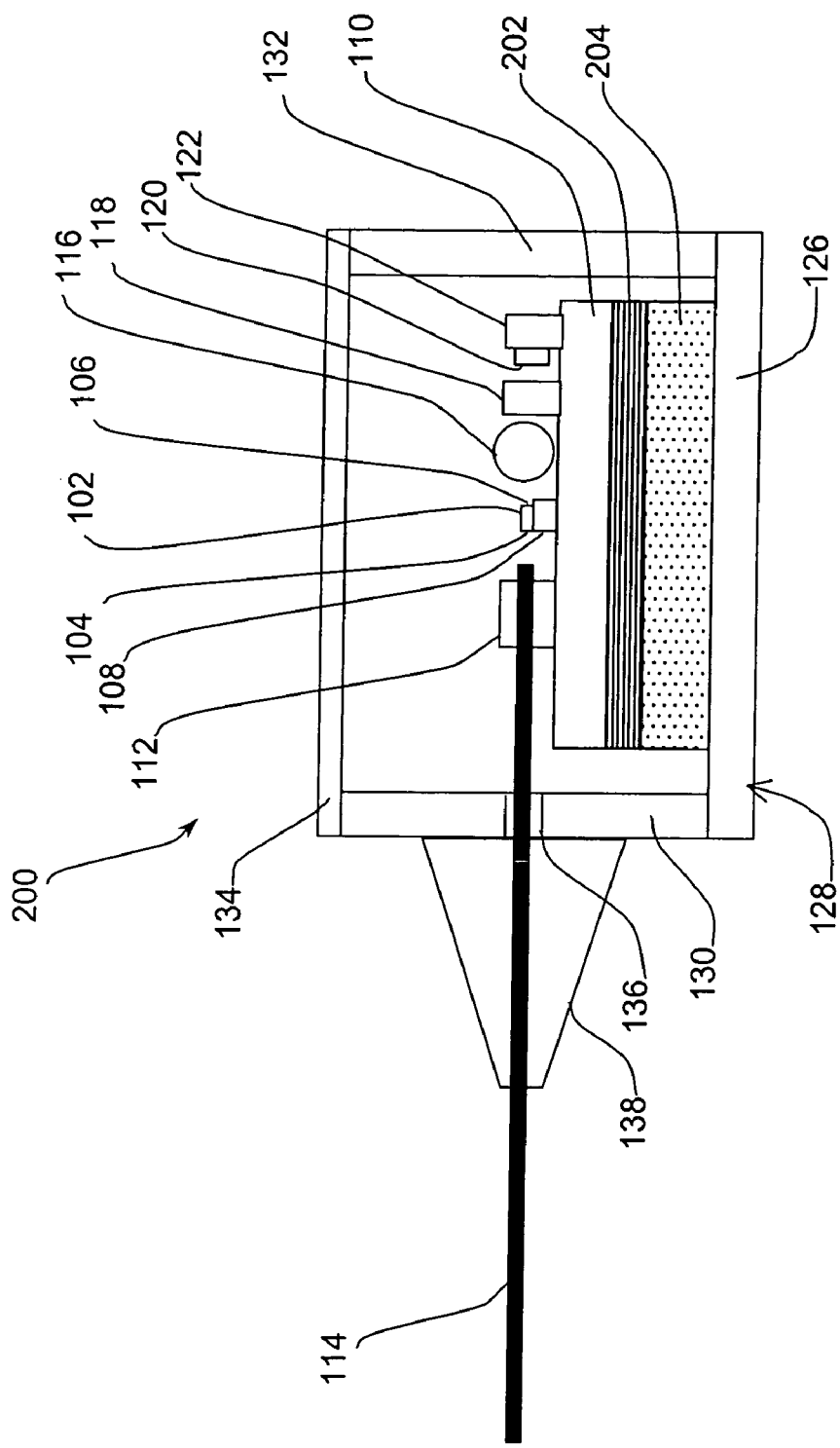
FIG. 2 is a schematic drawing of an optoelectronic module according to a first aspect of the present invention.

FIG. 2 shows an optoelectronic module 200 according to a first embodiment of the present invention in which the thermoelectric device 124 has been replaced by a heater device 202 and an insulating layer 204. The insulating layer 204 is optional, but, if present, may be ceramic, metallic or polymeric and may be modified, for example, by the inclusion of voids or particles with different thermal properties to control the degree of insulation. The degree of required insulation is determined by balancing the requirements for a low laser operating temperature (but still at or above the maximum case temperature of the module) and a maximum heating capability of the heater. A greater degree of insulation increases the laser operating temperature while reducing the required maximum heating capability of the heater whilst less insulation reduces the laser operating temperature while increasing the required maximum heating capability of the heater.

It might be possible, in certain circumstances that a satisfactory balance between the requirements of a low laser operating temperature and a maximum heating capability of the heater cannot be reached, particularly when the laser generates a substantial amount of heat. In this case a thermal switch could be substituted for the insulating layer.

Known thermal switches typically control a flow of heat by mechanically varying the width of a gap between a heat source and a heat sink. Typically the gap is filled with a heat conducting gas or fluid. Such mechanical thermal switches are large and may be adversely affected by mechanical shocks and vibration. Known solid state thermal switches include a FET modified by neutron bombardment disclosed in U.S. Pat. No. 6,429,137, liquid crystal cells disclosed in U.S. Pat. Nos. 4,515,206, 5,222,548 and 6,247,524, whereas in U.S. Pat. No. 4,742,867 the thermal path is modified by the growth of metal dendrites.

These known solid state thermal switches are generally not capable of very large changes of thermal conductance and may have other disadvantages, such as high operating voltages.

Figure 3:
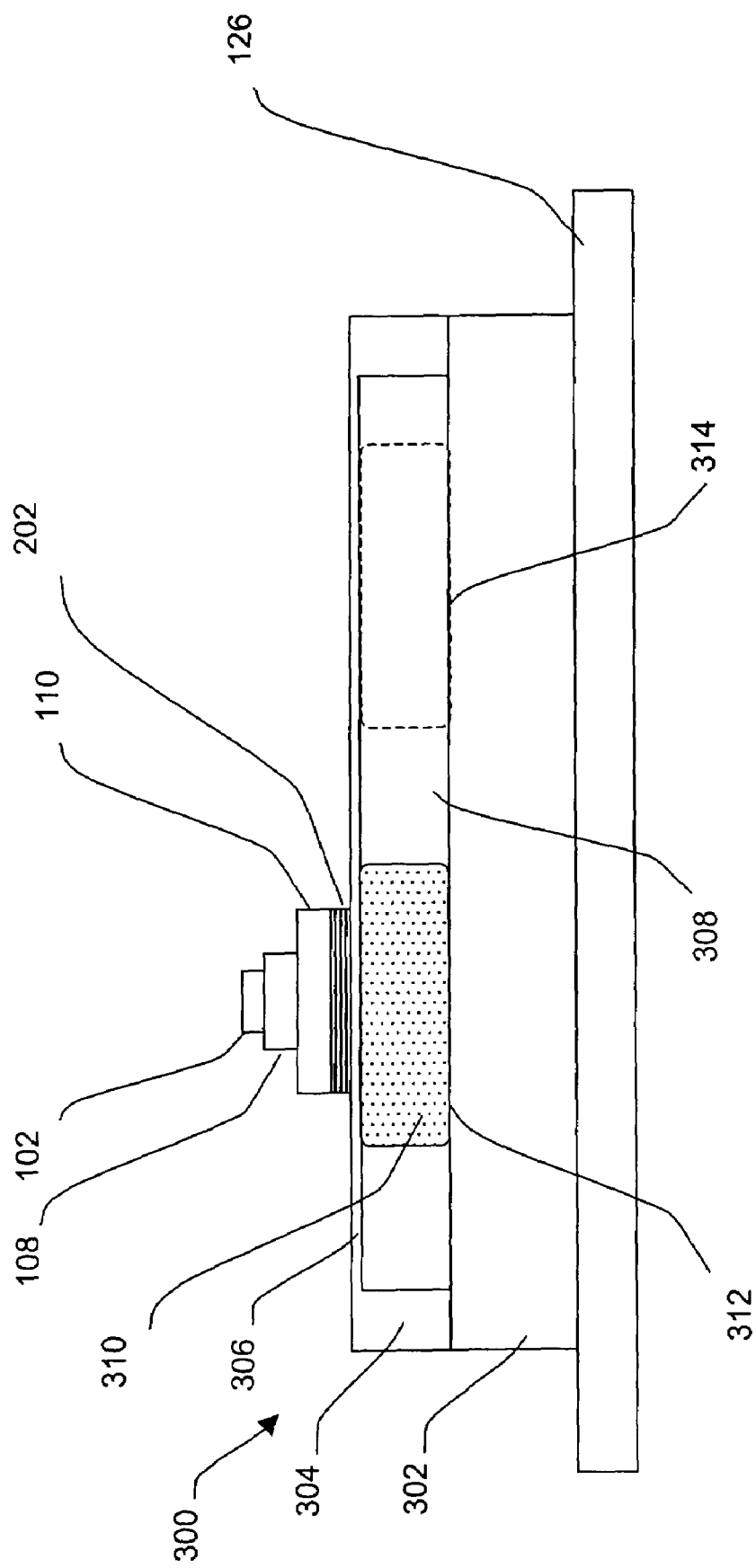
FIG. 3 is a schematic drawing of a thermal switch according to a second aspect of the present invention for use in an optoelectronic module.

FIG. 3, in which parts described with reference to FIGS. 1 and 2 are given the same numerals, illustrates in cross-section a thermal switch 300 according to an embodiment of the present invention, which is capable of a significant change in thermal conductance, is compact and can operate at low voltages.

The switch 300 comprises a base 302, a centre section 304 and lid 306. The base 302 provides a rigid support for the centre section 304 and lid 306 and is preferably made from a material with a high thermal conductivity, for example a ceramic material such as alumina. The lid 306 provides a support for the heater 202, substrate 110, heatsink 108 and laser 102. The lid 306 is preferably made of a material with a moderate or low thermal conductivity, for example silica, and is generally thin in order to provide relatively high thermal impedance laterally and relatively low thermal impedance vertically. The centre section 304 contains a channel 308, which in turn contains a drop of a relatively thermally conductive fluid 310. Mercury, gallium, sodium-potassium, or the like can be used as the conductive fluid 310. The switch 300 also comprises a means, not shown in this drawing but described below with reference to FIGS. 4 and 5, for displacing the conductive fluid 310 between a first position 312 below the heater 202 and a second position 314, indicated by the dashed outline, remote from the heater 202. When the conductive fluid 310 is in the first position 312, the base 302, conductive fluid 310, lid 306, heater 202, substrate 110 and heatsink 108 provide relatively low thermal impedance between the package base 126 and laser 102. When the conductive fluid 310 is in the second position 314, the thermal impedance between the package base 126 and laser 102 is relatively high.

Figure 4:
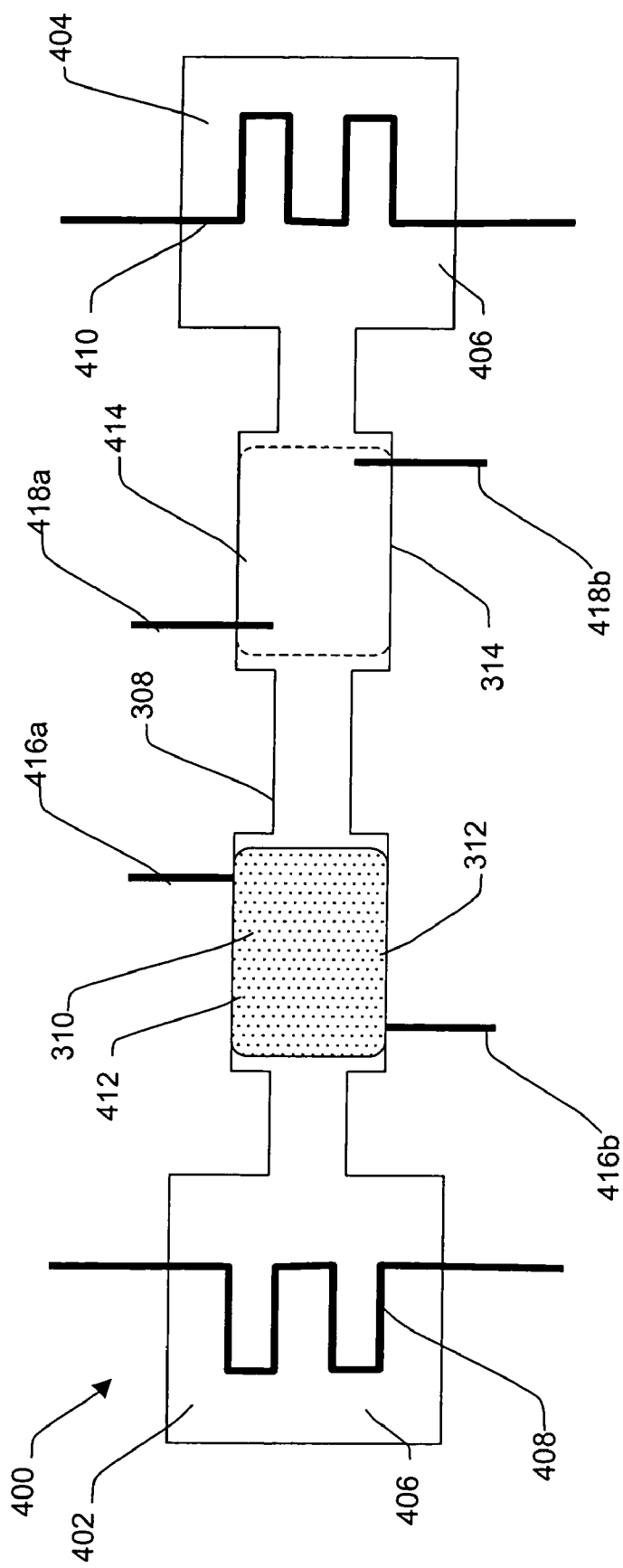
FIG. 4 shows, schematically, one mechanism for moving thermally conductive fluid in the thermal switch of FIG. 3.

FIG. 4 shows in plan view one embodiment of the means to displace the conductive fluid 310 between the first position 312 below the heater 202 (not shown in this drawing for clarity) and the second position 314.

As shown in FIG. 4, the means 400 for displacing the conductive fluid includes a first chamber 402, a second chamber 404 and the channel 308 containing the conductive fluid 310. The first chamber 402, the second chamber 404, and the channel 308, where it does not contain the conductive fluid 310 are filled, or partially filled, with a non-conductive fluid 406. These elements collectively constitute the cavity (or cavities) of the switch 400. If the non-conductive fluid 406 is a gas, it may include nitrogen, argon, helium, another inert gas, a mixture of these gases, or a non-inert gas such as hydrogen. A fluid, such as a fluorocarbon, an oil, an alcohol, water, or the vapour of such a fluid can alternatively be used. The choice as to which particular materials are used as the conductive fluid and the non-conductive fluid should take into account factors including, for example, whether the fluids chemically react with each other and whether the fluids undergo a chemical reaction with the walls of the cavities. The channel 308 is broadened at locations 312 and 314 to form two cavities 412 and 414 for holding the conductive fluid 310 in one of the two locations 312 and 314. Specifically, the conductive liquid can be latched in either of the locations 312 and 314.

The first chamber 402 and the second chamber 404 are disposed apart from one another, and each preferably has a rectangular shape. The chambers, 402 and 404, house heaters 408 and 410, respectively. The channel 308 extends from the side of the first chamber 402 that faces the second chamber 404 toward the second chamber 404. The width of the channel 308 is not less than the width of the heater 202 and the length of the channel 308 is substantially longer than the length of the heater 202. The conductive fluid 310 is placed into the channel 308 in an amount such that an area of the channel 308 equal to or somewhat larger than the area of the heater 202 is covered.

In this embodiment, the size and shape of the cross sections of the channel 308 and cavities 412 and 414 are designed and the nitrogen gas pressure during heating by the heaters 408 and 410 is determined such that the surface tension of conductive fluid 310 will substantially prevent the conductive fluid 310 from flowing from the channel 308 into the chambers 402 and 404. The surface tension of the conductive fluid 310 is affected by the wettability of the substances with which the conductive fluid 310 comes into contact. Increasing the wettability lowers the surface tension, whereas lowering the wettability increases the surface tension. Therefore, a large amount of the conductive fluid 310 can be kept from flowing from the channel 308 into the chambers 402 and 404 by forming the walls of the channel 308 from a material or materials having a low wettability with the conductive fluid 310.

The operation of the switch of this example will now be described. When the heaters 408 and 410 are off, the conductive fluid 310 is arranged to be at position 312 in channel 308, creating a low thermal impedance between the package base 126 and laser 102, the 'closed' position. If a current $I_1$, is passed through the heater 408 so that the heater 408 heats up, the internal pressure of the first chamber 402 will rise, and the non-conductive fluid 406 will exert pressure on the conductive fluid 310. As this pressure increases, conductive fluid 310 will be displaced from position 312 to position 314. At position 312 the conductive fluid 310 is replaced by the non-conductive fluid 406 thus creating a high thermal impedance between the package base 126 and laser 102, the 'open' position. By adjusting the current $I_1$, it is also possible to vary the position of the conductive fluid 310 between positions 312 and 314 and thus continuously vary the thermal impedance between the package base 126 and laser 102.

If the current to the heater 408 is switched off when the switch is in the 'open' state, the internal pressure of the first chamber 402 decreases and the conductive fluid 310 returns to position 312, thus closing the switch. The conductive fluid 310 can be quickly moved from position 314 to position 312, that is between the open and closed states, by passing a current $I_2$ to the heater 410 so that the heater 410 heats up, thereby increasing the pressure inside the second chamber 404.

Beneficially, the switch 400 may also comprise electrode pairs 416 and 418 extending into the cavities 412 and 414 so that when the conductive fluid 310 is in position 312 electrodes 416a and 416b are electrically connected and electrodes 418a and 418b are electrically isolated. Similarly when the conductive fluid 310 is in position 314 electrodes 416a and 416b are electrically isolated and electrodes 418a and 418b are electrically connected. By monitoring the resistance between the electrode pairs 416 and 418 the position of the conductive fluid 310 in the channel 308 can be determined and hence whether the switch 400 is open or closed. Other methods of determining whether the switch 400 is open or closed, such as by the obstruction of an optical beam are also possible.

Figure 5A:
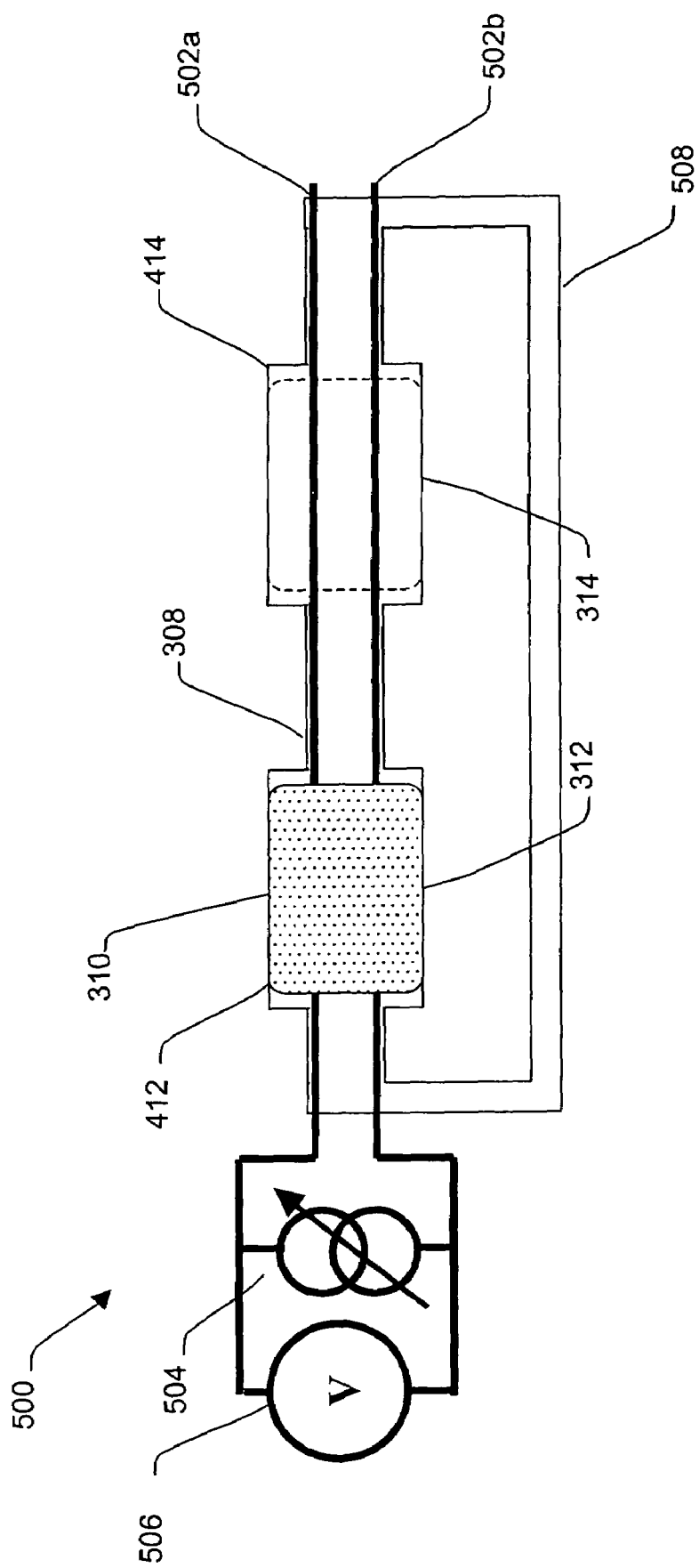

FIG. 5a shows, in plan view, a second embodiment of means 500 for displacing the conductive fluid 310 between the first position 312 and the second position 314.

In the second embodiment, two electrodes 502 run along the channel 308 forming an electrical circuit with a variable current source 504 and the conductive fluid 310, which must also be electrically conductive in this embodiment. The two electrodes 502a and 502b have a resistance per unit length and a voltmeter 506 is arranged to measure the voltage between the electrodes 502a and 502b. Thus, when the current source 504 provides a current $I_3$ the voltmeter 506 measures a different voltage depending on whether the conductive fluid 310 is in the first position 312 or the second position 314. Optionally a relief channel 508 is provided to equalise the pressure in channel 308.

FIG. 5b shows a side elevation of the second embodiment of the means 500 for displacing the conductive fluid. The channel 308 containing the conductive fluid 310 and provided with the electrodes 502 is disposed between two magnetic poles 510 and 512. The magnetic poles 510 and 512 may be the north and south poles of the same magnet or of different magnets and are arranged, as shown in FIG. 5c, such that the magnetic field 514 between them is substantially normal to the plane in which the electrodes 502 lie.

In operation the variable current source 504 drives a current $I_4$ through the first electrode 502a, the conductive fluid 310, and the second electrode 502b. The combination of the current $I_4$ flowing through the conductive fluid 310 and the magnetic field 514 causes the conductive fluid 310 to experience a force directed along the length of the channel 308 thus moving the conductive fluid 310 from position 312 to position 314, that is between the closed and open states. By reversing the direction of the current $I_4$ (or the magnetic field 514) the direction of the force is reversed and the conductive fluid 310 can be returned from position 314 to position 312, thus closing the switch.

It will be appreciated that although only some particular embodiments of the invention have been described in detail, various modifications and improvements can be made by a person skilled in the art without departing from the scope of the present invention. For example, although one aspect of the invention has been described in relation to the use of a quantum dot laser in an optoelectronic module, other optoelectronic modules could include other types of optoelectronic components, such as a semiconductor optoelectronic amplifier.

What is claimed is:

1. A thermal switch for switchably providing either a relatively low or relatively high thermal impedance between a heat source side of the thermal switch and a heat sink side of the thermal switch, the thermal switch comprising:
   a channel having a first location between the heat source and heat sink sides of the thermal switch and a second location;
   a thermally conductive fluid within the channel, the fluid having a surface tension such that it remains substantially as a single dronlet and does not flow spontaneously along the channel;
   a pair of electrodes extending in a plane through the length of the channel such that the droplet of thermally conductive fluid, which is also electrically conducting, provides an electrical path between the electrodes; and
   a pair of magnetic poles arranged to provide a magnetic field in a direction orthogonal to the plane containing the pair of electrodes and a longitudinal axis of the channel, whereby provision of electric current through the pair of electrodes and through the droplet of thermally conductive fluid causes a force to be exerted on the droplet of thermally conductive fluid to move it along the channel between the first and second locations.

2. A thermal switch according to claim 1 wherein the first and the second locations comprise first and second cavities, respectively, in the channel for receiving the droplet of thermally conductive fluid, which substantially fills the cavity in which it is located.

3. A thermal switch according to claim 1, further comprising a current source coupled between the electrodes at one end of the channel and a voltage meter electrically coupled across the current source, whereby the voltage meter measures a different voltage depending on the location of the droplet of thermally conductive fluid when an electric current is passed through the pair of electrodes.

4. A thermal switch according to claim 1, further comprising a relief channel coupling the first and the second cavities.

* * * * *

UNITED STATES PATENT AND TRADEMARK OFFICE
CERTIFICATE OF CORRECTION

PATENT NO. : 7,191,823 B2  Page 1 of 1
APPLICATION NO. : 10/773607
DATED : March 20, 2007
INVENTOR(S) : Andrew Harker It is certified that error appears in the above-identified patent and that said Letters Patent is hereby corrected as shown below:

Col. 2 Line 3 After "specified" delete ",".

Col. 8 Line 28 In Claim 1, delete "dronlet" and insert -- droplet --, therefor.

Col. 8 Line 38–39 In Claim 1, delete "thernally" and insert -- thermally --, therefor.

Col. 8 Line 43 In Claim 2, after "Claim 1" insert -- , --.

Signed and Sealed this

Twenty-third Day of December, 2008

JON W. DUDAS
*Director of the United States Patent and Trademark Office*